US006597067B1

(12) United States Patent
Biery et al.

(10) Patent No.: US 6,597,067 B1
(45) Date of Patent: Jul. 22, 2003

(54) SELF-ALIGNED, LATERAL DIFFUSION BARRIER IN METAL LINES TO ELIMINATE ELECTROMIGRATION

(75) Inventors: Glenn Allen Biery, Poughkeepsie, NY (US); Daniel Mark Boyne, Austin, TX (US); Hormazdyar Minocher Dalal, Milton, NY (US); H. Daniel Schnurmann, Monsey, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 08/839,843

(22) Filed: Apr. 17, 1997

Related U.S. Application Data (60) Continuation of application No. 08/573,831, filed on Dec. 18, 1995, now abandoned, which is a continuation-in-part of application No. 08/444,466, filed on May 19, 1995, now abandoned, which is a division of application No. 08/203,158, filed on Feb. 28, 1994, now Pat. No. 5,470,788.

(51) Int. Cl.[7] .................. H01L 23/48; H01L 29/46; H01L 29/54

(52) U.S. Cl. .............. 257/751; 257/700; 257/701; 257/758; 257/750; 257/915; 257/774; 257/766; 257/763; 257/764; 257/765; 257/761

(58) Field of Search ................ 257/750, 751, 257/761–770, 776, 915, 700, 701, 774

(56) References Cited

U.S. PATENT DOCUMENTS

| | | | | |
|---|---|---|---|---|
| 3,813,263 A | | 5/1974 | Rosenberg | 112/201 |
| 4,121,241 A | * | 10/1978 | Drake et al. | 257/767 |
| 4,154,874 A | | 5/1979 | Howard et al. | 427/91 |
| 4,636,404 A | | 1/1987 | Raffel et al. | 427/53.1 |
| 4,826,785 A | | 5/1989 | McClure et al. | 437/174 |
| 5,036,382 A | * | 7/1991 | Yamaha | 257/767 |
| 5,101,261 A | | 3/1992 | Maeda | 357/68 |
| 5,439,731 A | * | 8/1995 | Li et al. | 257/763 |
| 5,557,148 A | * | 9/1996 | Cain | 257/767 |
| 5,585,674 A | * | 12/1996 | Geffken et al. | 257/765 |

FOREIGN PATENT DOCUMENTS

| | | | | |
|---|---|---|---|---|
| JP | 0101653 | * | 4/1989 | 257/773 |
| JP | 4-67635 | | 3/1992 | |
| JP | 4-116829 | | 4/1992 | |

OTHER PUBLICATIONS

R. G. Filippi, et al, "Evidence of the Electromigration Short–Length Effect in Aluminum–Based Metallurgy with Tungsten Diffusion Barriers" Mat. Res. Soc. Symp. Proc., vol. 309, pp. 141–148, 1993.

\* cited by examiner

Primary Examiner—Alexander O. Williams
(74) Attorney, Agent, or Firm—Margaret A. Pepper

(57) ABSTRACT

An interconnection wiring structure in an integrated circuit chip designed to eliminate electromigration. The structure includes segments of aluminum interspersed with segments of refractory metal, wherein each aluminum segment is followed by a segment of refractory metal. The aluminum and refractory metal segments are aligned with respect to each other to ensure electrical continuity and to force the electrical current to sequentially cross the aluminum and the refractory metal segments. The above structure can be advantageously enhanced by adding an underlayer, an overlayer or both, all of which are made of refractory metal. The interconnection wire structure described above can be expanded to include vias or studs linking interconnection lines placed at different levels of the IC chip.

19 Claims, 9 Drawing Sheets

SELF-ALIGNED, LATERAL DIFFUSION BARRIER IN METAL LINES TO ELIMINATE ELECTROMIGRATION

CROSS-REFERENCE TO RELATED PATENT APPLICATIONS

This application is a continuation of application Ser. No. 08/573,831, filed Dec. 18, 1995, now abandoned, which is a continuation-in-part of application Ser. No 08/444,466 filed on May 19, 1995, now abandoned, which is a divisional of application Ser. No. 08/203,158 file on Feb. 28, 1994, now issued as U.S. Pat. No. 5,470,788.

FIELD OF THE INVENTION

The present invention is generally related to semiconductor devices and, more particularly, to the design of metal contacts and interconnections for semiconductor integrated circuits to eliminate electromigration failure. The invention also relates to providing various processes for obtaining the designed structure.

BACKGROUND OF THE INVENTION

The reliability of aluminum-based interconnections in microelectronic circuits is generally limited by a phenomenon known as electromigration. As microelectronic circuits are made more dense in order to improve performance, the electric fields (and resulting current densities) in the aluminum interconnects increase. Hence, as circuit densities increase, the rate of electromigration also increases.

Electromigration leads to circuit failure primarily via two mechanisms. In the first, aluminum electromigrates away from a region in the interconnect faster than the availability of additional atoms can take its place. This process generates a void in the interconnection. Growth of this void increases the electrical resistance of the interconnection to a point where circuit failure occurs. The second means by which electromigration failure occurs is when metal electromigrates into a region faster than it escapes the region, thus locally piling up metal atoms (called extrusions) to a point where it extends to the adjacent interconnection line, thereby causing an electrical short circuit.

The problem of electromigration has been approached in a number of ways, the two most common are: (1) introducing a second species into the parent metal, e.g., alloying aluminum with a 0.2% to 4% copper, and (2) utilizing a redundant metal layer, e.g., titanium, tungsten or chromium layer(s) under and/or over the aluminum lines.

The addition of Cu into the Al line has been described by Ames, et al., in U.S. Pat. No. 3,879,840, and of common assignee. The formation of a thin intermetallic layer within the Al-Cu has been described by J. K. Howard in U.S. Pat. Nos. 4,017,890 and 4,154,874, and of common assignee. While the above methods increase electromigration lifetime, it has been found that electromigration failure cannot be totally avoided because void growth cannot completely be suppressed, i.e., void sizes increase with time. The use of redundant layers can extend the electromigration lifetime of metal lines by a factor of 10 to 100 over non-redundant schemes. The present invention, however, offers a lifetime extension in excess of 1000X. This is because with the present invention, void growth is totally eliminated, which is made possible by a phenomenon known as the short-length effect.

The short-length effect takes place in short aluminum interconnections if an electrical current is supplied through leads of materials in which aluminum diffusivity is low. The physical origin of the short-length effect is the build-up of backstress as aluminum atoms pile up against the diffusion barrier leads; this backstress counteracts the electromigration driving force. A steady-state condition arises in situations where the backstress exactly balances the electromigration driving force. Under this condition, no further electromigration damage results.

The existence of the short-length effect has been demonstrated by several investigators as, for instance, by H. V. Schreiber in the article: "Electromigration Threshold of Aluminum Films" published in Solid State Electronics, Vol. 28, No. 6, p. 617, by R. G. Filippi, et al., in the article: "Evidence of the Electromigration Short-Length Effect in Aluminum based Metallurgy with Tungsten Diffusion Barriers" published in the Proceedings of the Materials Research Symposium, Vol. 309, pp. 141–148, and by X. X. Li et al., in the article: "Increase in Electromigration Resistance by Enhancing Backflow Effect" published in the Proceedings of the 30th International Reliability Physics Symposium, March 1992, p. 211. Based on experimental evidence, an interconnection of length L will show electromigration immunity for an applied current density below a critical value $j_{cr}$. This $j_{cr}$ has been found to be inversely proportional to the interconnection length L. The above investigators of the short-length effect use various schemes to prove the existence of this phenomenon. However, these schemes do not utilize the self-aligned features and fine pitch which are essential for the manufacturability of Very Large and for Ultra Large Scale Integration circuits (VLSI and ULSI).

Objects of the Invention

Accordingly, it is an object of the present invention to describe several metallurgical structures that utilize the short-length phenomenon practiced in a VLSI and ULSI circuit environment.

It is another object of the present invention to provide an interconnection metallurgy having ultra small pitch and which is immune to electromigration failure.

It is a further object of the present invent-ion to form an aluminum or copper metallurgy line having diffusion barrier interposed in series every 50 to 100 $\mu$m.

It is still another object of the present invention to form an interconnection line by interspersing islands of refractory metal between sections of a high conductivity material.

It is yet another object of the present invention to provide an underlayer, an overlayer or both, contacting the individual sections of high conductivity and sections of refractory metal to ensure better electrical integrity.

It is still a more particular object of the present invention to provide studs linking interconnection lines between different levels of an IC chip having the same structure as that described for the interconnection line.

SUMMARY OF THE INVENTION

The invention provides several distinct embodiments, each having a self-alignment feature, to achieve the desired metallurgical structure. In some aspects of the present invention, an aluminum segment is defined by an additive process, e.g., lift-off or Damascene, whereas a tungsten segment is defined by either an additive or a subtractive process. In some other aspects of the invention, the aluminum segment is defined only by a subtractive process, e.g., Reactive-Ion-Etch (RIE), whereas the tungsten segment is defined by either an additive or a subtractive process.

In accordance with one embodiment of the present invention, there is provided an interconnection wiring structure on an insulated substrate in an integrated circuit chip for minimizing electromigration, that includes: a sublayer of a diffusion barrier metal on the insulated layer; sections of high conductivity metal on the sublayer; coplanar sections of the diffusion barrier metal interspersed between the sections of high conductivity metal, such that the sections of high conductivity metal and the sections of diffusion barrier metal contact each other to carry an electrical current, such that the electrical current sequentially crosses the sections of high conductivity metal and the sections of diffusion barrier metal.

In another aspect of the invention, there is provided in an integrated circuit chip having more than one level of wiring, each of the levels of wiring having at least one stud linking at least one interconnection in a first level to another interconnection in a second level, the interconnections designed for minimizing electromigration, the stud including: sections of conductive material; sections of diffusion barrier metal interspersed with the conductive sections, the sections of conductive material and the sections of diffusion barrier metal contacting each other to provide electrical continuity, such that an electrical current flowing through the stud sequentially crosses each of the conductive sections and the diffusion barrier metal sections.

BRIEF DESCRIPTION OF THE DRAWINGS

The foregoing and other objects, aspects and advantages will be better understood from the following detailed description of a preferred embodiment of the invention with references to the drawings, in which.

DETAILED DESCRIPTION OF THE PREFERRED EMBODIMENTS

Unless defined otherwise, all technical and scientific terms used herein have the same meaning as commonly understood by those of ordinary skill in the art to which this invention belongs. Although any methods and materials similar or equivalent to those described herein can be used in the practice or testing of the present invention, the methods and materials described herein are preferred. The materials, methods and examples are only exemplary and not limiting.

Referring now to the drawings, wherein like reference numerals represent the same or similar parts throughout, and more particularly, to layers 1 and 2 in all drawings, they respectively represent conventional substrate and passivating layers. To those skilled in the art, it should be apparent that the substrate could be a semiconductor wafer, wherein a plurality of devices (not shown) have been formed by conventional methods or, a substrate made of ceramic or organic material with or without interlayers of wiring channels. Likewise, the passivation layer could include inorganic or organic components or a combination thereof.

Figure 2A:
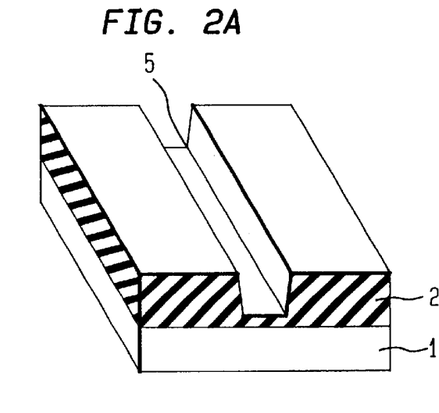
FIGS. 2a–2e show the desired end product of FIG. 1 at various stages of the manufacturing process thereof, according to one embodiment of the present invention, wherein both aluminum and tungsten segments are defined by a Damascene process.

Referring to FIG. 2a, a passivation layer 2 of $SiO_2$ is deposited over the surface of substrate 1. Trench 5 corresponds to an interconnection line pattern defined in a single or multi-layer structure of photoresist on top of the passivation layer 2. It is formed by reactively ion etching (RIE) the passivation layer 2 to a depth dictated by the required interconnection line thickness. While only one trench 5 is shown, it should be understood that more than one trench can be defined.

Figure 2B:
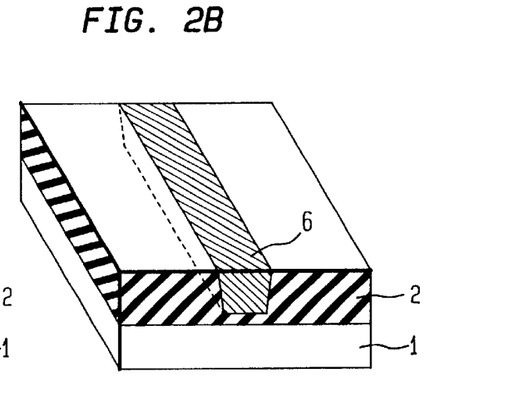

The next step of the process is to fill this trench (or trenches) with a diffusion barrier made of tungsten or any other similar refractory metal, such as molybdenum, tantalum, titanium, chromium, chromium/chromium oxide or any combination thereof as shown in FIG. 2b. This can be accomplished by first depositing a tungsten layer by CVD (Chemical Vapor Deposition) technique to a thickness at least equal to the depth of trenches 5, and removing excess tungsten by chemical-mechanical polish to leave a clean passivation surface 2 and a planarized tungsten filled trench (or trenches) 6.

Figure 2C:
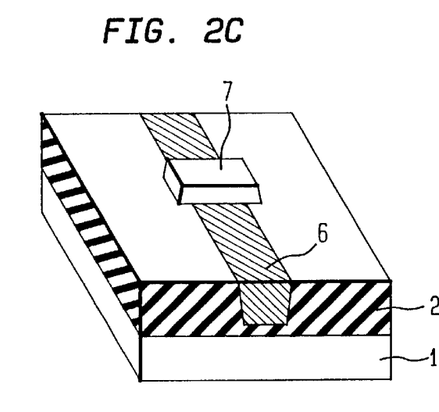
Figure 2D:
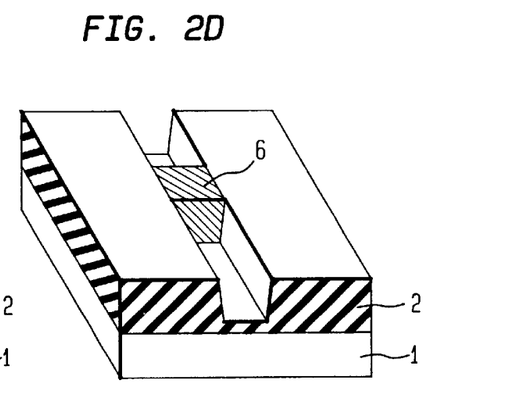
Figure 2E:
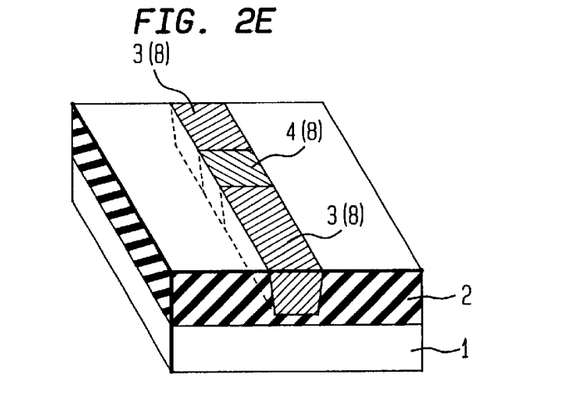

Photoresist is next applied and patterned to form a photoresist island 7 over a small portion of the tungsten line 6, as depicted in FIG. 2c. The exposed tungsten is then reactively ion etched away using fluorine based gas, thereby leaving short segments of tungsten 6(4) in the trenches shown in FIG. 2d. Next, a blanket layer of aluminum or aluminum alloy is deposited and chemical-mechanical polished to fill the rest of the trench with aluminum 8(3) as shown in FIG. 2e.

This process results in the desired interconnection pattern structure (FIG. 1) comprising alternate aluminum and tungsten segments wherein the two segments are advantageously self-aligned.

It should be evident to those skilled in the art that the above method could be modified by interchanging metals, the associated etches and the sequence of process. By way of example, aluminum (or aluminum alloy) or copper, could be first deposited, polished and patterned using a chlorine based reactive ion etch, leaving small segments of aluminum (or aluminum alloy or copper) in the trench. This would be followed by a deposition of tungsten or any other refractory metal, such as molybdenum, tantalum, titanium, chromium, chromium/chromium oxide or any combination thereof, followed by chemical-mechanical polish to remove any excess tungsten, thereby leaving the passivation layer 2 clean.

Figure 3A:
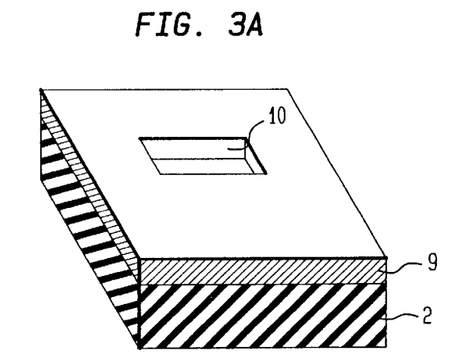
FIGS. 3a–3h show the desired end product of FIG. 1 at various stages of the manufacturing process thereof, according to another embodiment of the invention, wherein the aluminum segment is essentially defined by a reactive ion etching technique and the tungsten segment is defined by a Damascene technique.

In another embodiment of this invention, a blanket layer of aluminum or its alloys 9, in FIG. 3a, is deposited and an array of holes 10 is formed by photomasking and reactively ion etching aluminum. The array is designed to be spaced no more than the minimum length of wire the circuit requires or 100 µm, whichever is less.

Figure 3B:
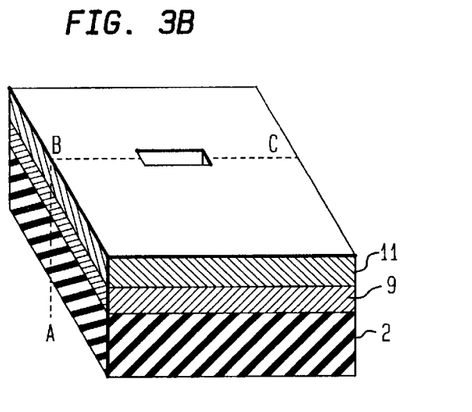
Figure 3C:
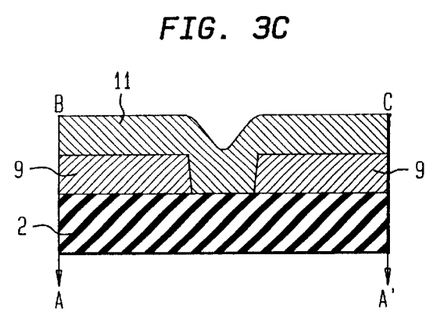
Figure 3D:
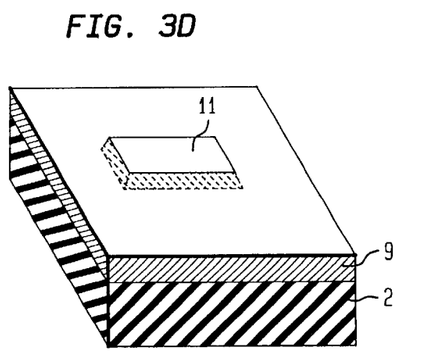
Figure 3E:
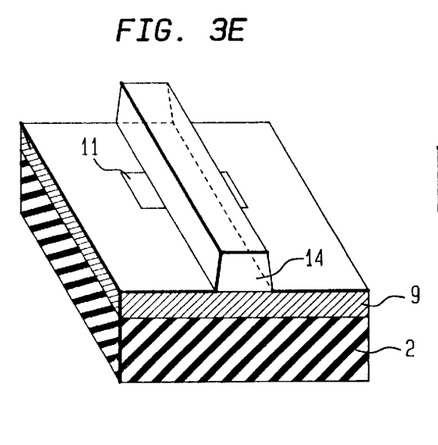
Figure 3F:
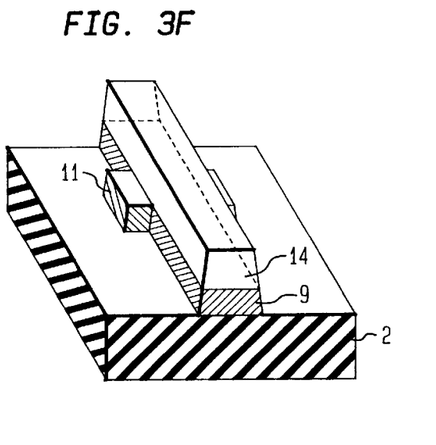
Figure 3G:
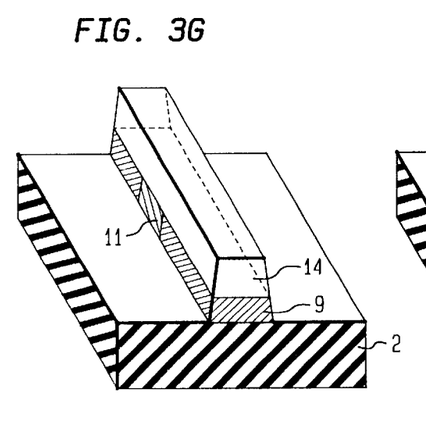
Figure 3H:
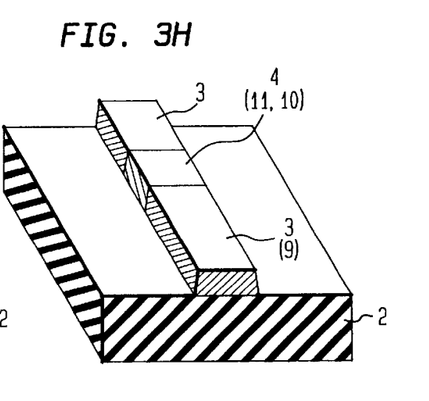

A tungsten layer 11 is next deposited to a thickness greater than the aluminum layer thickness (FIGS. 3b and 3c). Excess tungsten 11 is chemical-mechanical polished until the aluminum surface 9 is exposed (FIG. 3d). This composite layer is then patterned for the required wiring by photomasking 14 (FIG. 3e), and aluminum is reactively ion etched in a chlorine based gas until the underlaying passivation surface 2 is clean (FIG. 3f). A fluorine based RIE is used to etch remove any tungsten protruding from the sides (FIG. 3g). After resist stripping, the desired wiring structure (FIG. 3h) is achieved.

With judicious combination of wiring and tungsten array layout, one may avoid having any protruding tungsten. Hence, fluorine based etching may not be required altogether.

The previously described embodiment can likewise be modified to first forming rectangular holes in tungsten by first depositing a layer of tungsten, patterning it as per the array pattern by appropriate photomasking, and reactively ion etching the tungsten with a fluorine based gas. The rectangle thus formed should preferably be such that its length exceeds the width of an interconnection wire. Next, depositing a blanket layer of aluminum and polishing excess aluminum will result in a planarized surface of aluminum and tungsten. The desired wiring pattern is defined by photomasking and reactively ion etching the aluminum in a chlorine based gas. Any protruding tungsten is etched by fluorine based reactive etching.

Figure 4A:
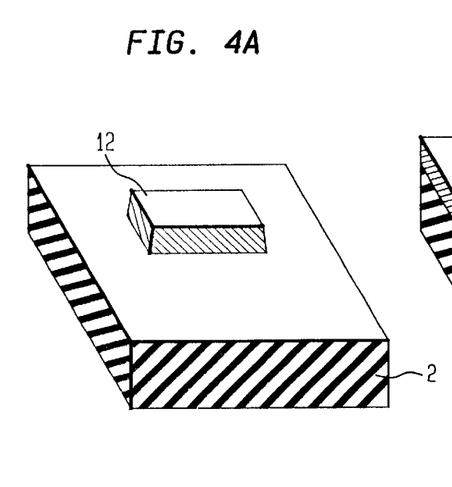
FIGS. 4a–4g show the desired end product of FIG. 1, at various stages of the manufacturing process thereof, according to yet another embodiment of the invention, wherein both aluminum and tungsten segments are fabricated using a subtractive etching technique, e.g., RIE.
Figure 4B:
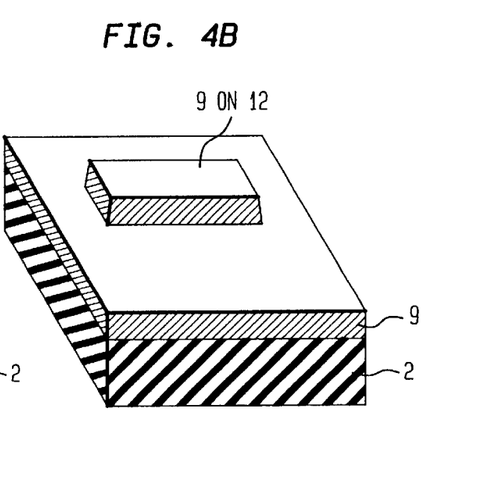
Figures 4C, 4D:
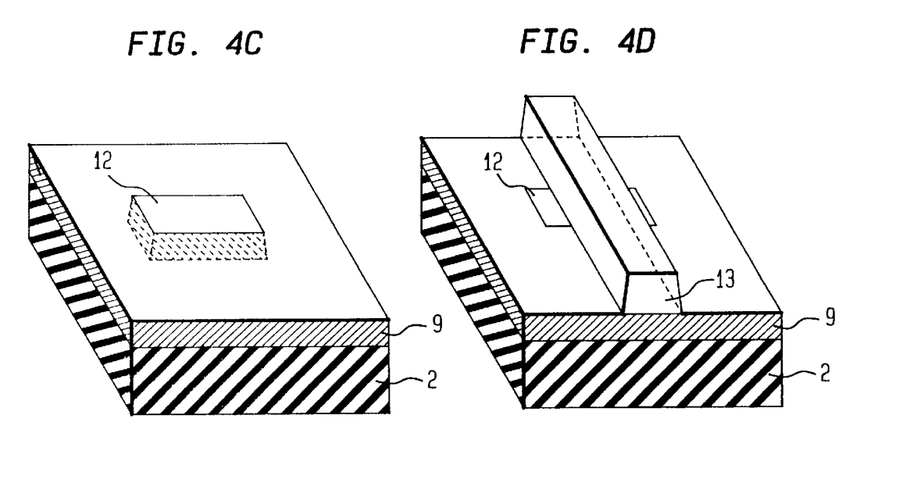
Figure 4E:
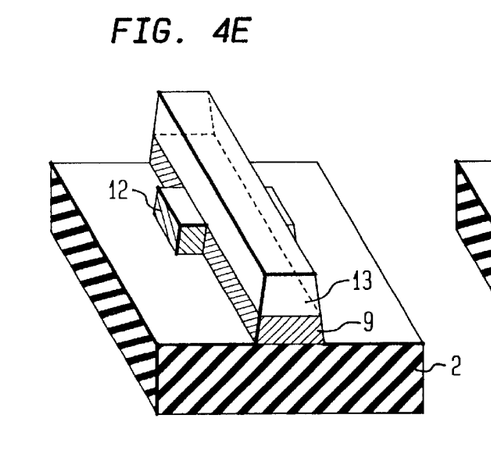
Figure 4F:
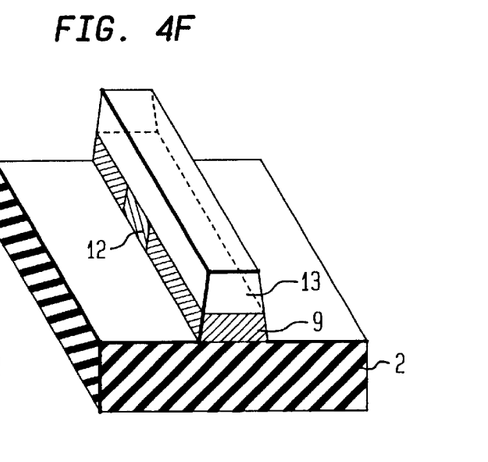
Figure 4G:
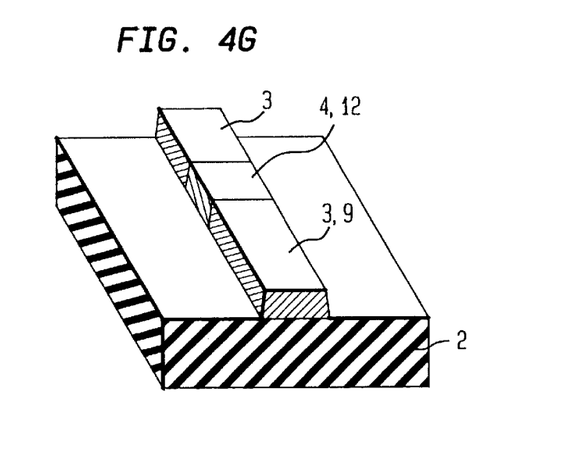

In yet another embodiment, a first tungsten island 12 in FIG. 4a is formed, and a blanket aluminum layer 9 (FIG. 4b) is deposited. The substrate is chemical-mechanical polished to planarize and expose the embedded tungsten 12 (FIG. 4c). A photoresist pattern 13, according to the desired wiring pattern is formed (FIG. 4d) and aluminum is reactively ion etched (FIG. 4e). The protruding tungsten 12 is reactively ion etched (FIG. 4f) and the resist mask 13 is removed, leaving self-aligned aluminum 3 and tungsten 4 segments in the desired wiring pattern (FIG. 4g). It should be emphasized that the intermediate structure of tungsten islands (FIG. 4a) in this embodiment could also be achieved by first subjecting the wafer to selective tungsten deposition by Chemical Vapor Deposition (CVD).

Figure 1:
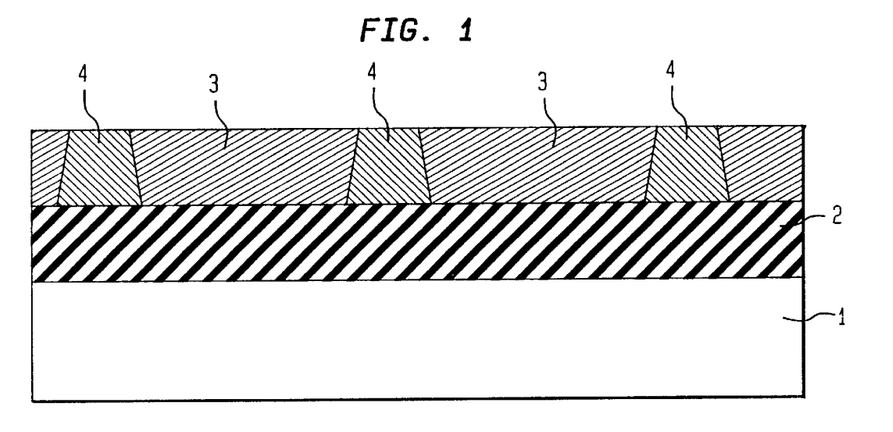
FIG. 1 shows a cross section of a desired end product according to the present invention that includes a silicon wafer with a passivation layer and aluminum segments of the metal line in series with tungsten segments.

Any of the above-mentioned embodiments and modifications thereof result in desired wiring lines composed of aluminum or other similar high conductivity metal segments in series with self-aligned tungsten diffusion barrier segments, as illustrated in FIG. 1. Furthermore, the high conductivity metal may be comprised of an underlay (i.e., a thin layer of refractory metal lying under the high conductivity metal) or an overlay (i.e., a thin layer of refractory metal placed on top of the high conductivity metal), or both, underlay and overlay. The CVD tungsten, shown in FIG. 1, acts as the barrier material of choice, but any material in which aluminum diffusivity is small at processing temperatures, such as any of the refractory metals mentioned above, could also be used advantageously. For complete blockage of electromigration, the maximum aluminum segment length is current density dependent. The aluminum segment length decreases inversely as the current density increases. Typically, the length of the sections of high conductivity metal varies between 1 to 100 µm. The maximum length of the diffusion barrier metal should be chosen such that it can tolerate an increase in line resistance. The lower limit is lithographically determined, typically, with the barrier metal having a length ranging from 0.1 to 100 µm. The increase in wiring line resistance caused by somewhat higher resistance of the diffusion barrier metal is usually less than 15 percent.

Figure 5:
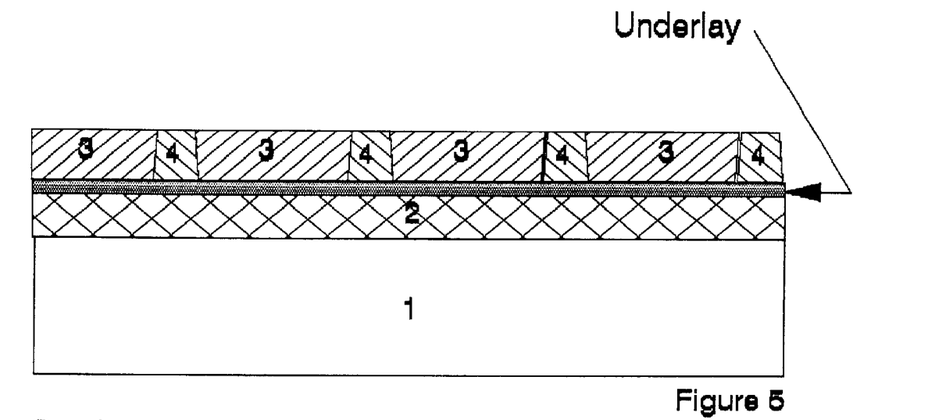
FIG. 5 is a perspective view of still another embodiment of the present invention showing conductive islands interspersed with islands of refractory metal, wherein the islands are further linked to each other by underlay metallurgy.

Referring to FIG. 5, an underlayer (or sublayer) is placed on insulating layer 2 at a place where an interconnection line is to be made. On top of the underlayer, islands of refractory and conductive metal are interspersed to each other to form an continuous interconnection line capable of carrying current. The underlay metallurgy, preferably of refractory metal, such as titanium, molybdenum, chromium, tantalum, titanium-nitride, tantalum-nitride and the like, provides a safeguard in the event a failure occurs in the structure placed above the underlayer. The refractory metal underlayer is preferably made of a material which is different from that selected for the refractory metal islands. The underlayer also facilitates the various steps required to process such an interconnection wiring structure.

Figure 6:
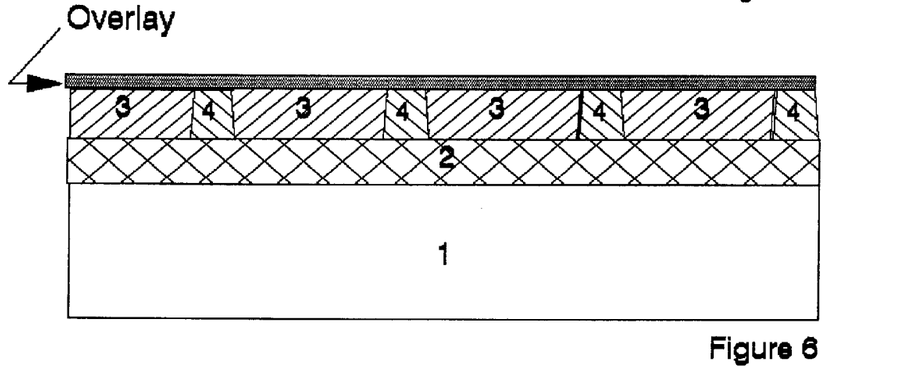
FIG. 6 is a perspective view of a yet another embodiment of the present invention showing conductive and refractory metal islands interspersed therebetween and further connected by overlay metallurgy.

FIG. 6 is similar to FIG. 5, except that instead of a sublayer, an overlayer is deposited on top of the interconnection line made of refractory metal and conductive islands.

Figure 7:
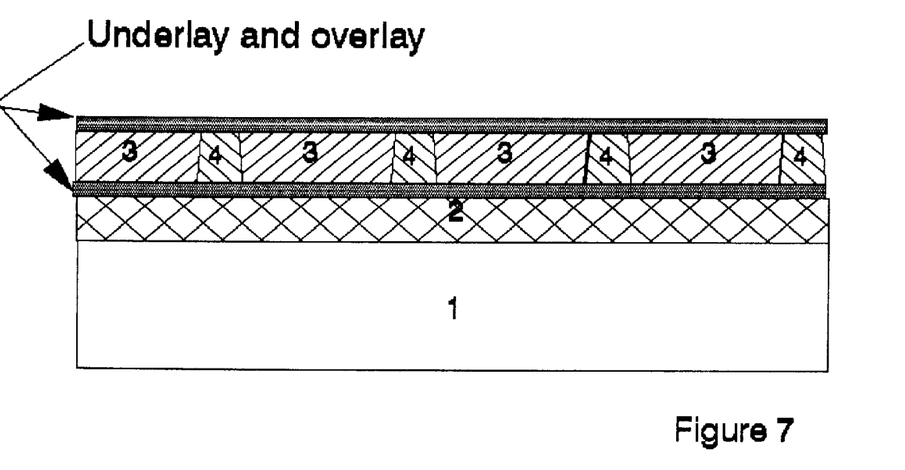
FIG. 7 illustrates yet another perspective view of an embodiment of the present invention, wherein the conductive and refractory metal islands are further interconnected by both underlay and overlay metallurgy.

FIG. 7 is a composite of the structure shown in FIGS. 5 and 6, with both an underlayer and an overlayer present therein.

Figure 8:
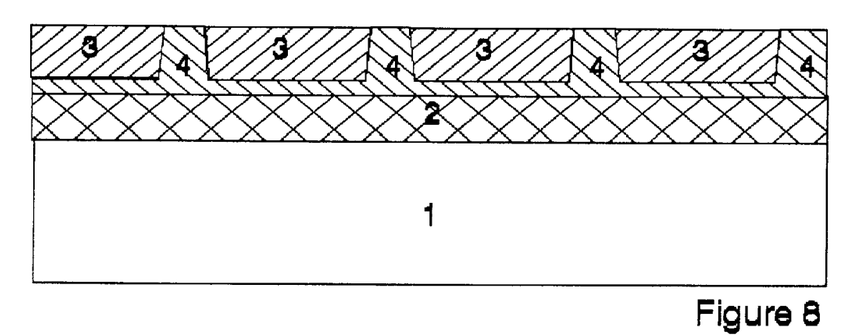
FIG. 8 is a perspective view of still another embodiment of the present invention, having a continuous refractory metal layer with integrated columns placed at periodic intervals, wherein conductive material islands are positioned between the columns and on top of the continuous layer.

Referring now to FIG. 8, there is shown a layer of refractory metal placed on insulating layer 2, wherein columns of refractory metal, integral to the refractory metal underlayer, protrude upwards. Conductive islands are positioned between the columns insuring electrical continuity between the islands through the columns. The material used for the integral underlayer and the protruding columns is chosen from a group consisting of titanium, titanium nitride, tantalum, tantalum nitride, chromium, molybdenum and the like.

Figure 9:
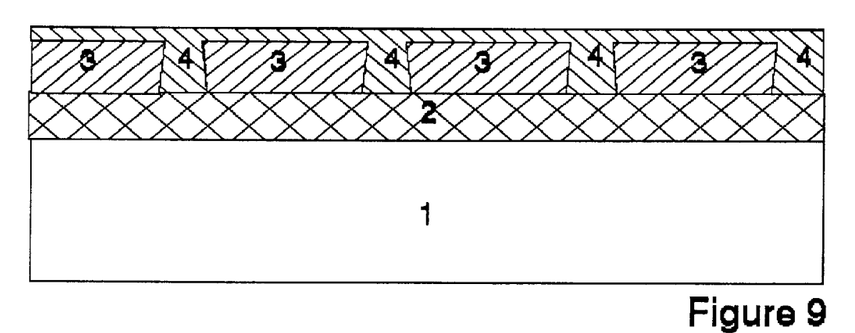
FIG. 9 is a perspective view of still another embodiment of the present invention, having conductive islands positioned between columns of refractory metal that are integral to a layer of refractory metal positioned above the conductive islands.

FIG. 9 shows a similar structure to that shown in FIG. 8, with the exception that the layer is now placed on top of the integral columns and conductive islands. A plurality of individual Al islands, separated from one another by a void, is positioned on the insulated substrate of the IC chip at a place where an interconnection wire is desired. The Al islands are formed using conventional photo-lithographic techniques. A layer of refractory material is then deposited such that the voids between the Al islands are fully covered.

Thus, the layer not only fills the existing voids, but by it extending over the Al islands, it ensures electrical integrity, while simultaneously providing an effective barrier to electromigration.

Figure 10:
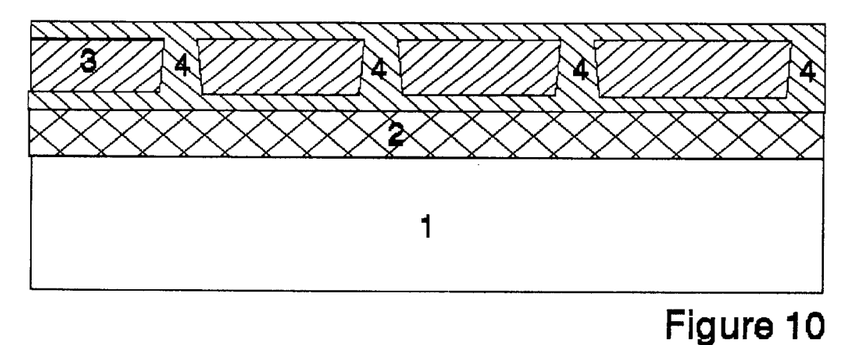
FIG. 10 illustrates a perspective view of a further embodiment of the present invention, wherein conductive islands are embedded between two refractory metal layers, which are connected to each other at periodic intervals by refractory metal islands.

Finally, FIG. 10 illustrates a composite representation of FIGS. 8 and 9, such that the conductive islands are totally embedded between adjacent refractory metal columns and between the upper and the lower layers.

Practitioners of the art will fully appreciate that interconnections in integrated circuit chips commonly span over more than one level of metallization. Electrical continuity between conductive lines in different planes is secured by the use of conductive vias, also referred to as via studs. Similarly, the contact between a metallized line and an active device is referred to as a contact or contact stud. Generically, both kinds of studs are referred as a via or a stud.

Figure 11:
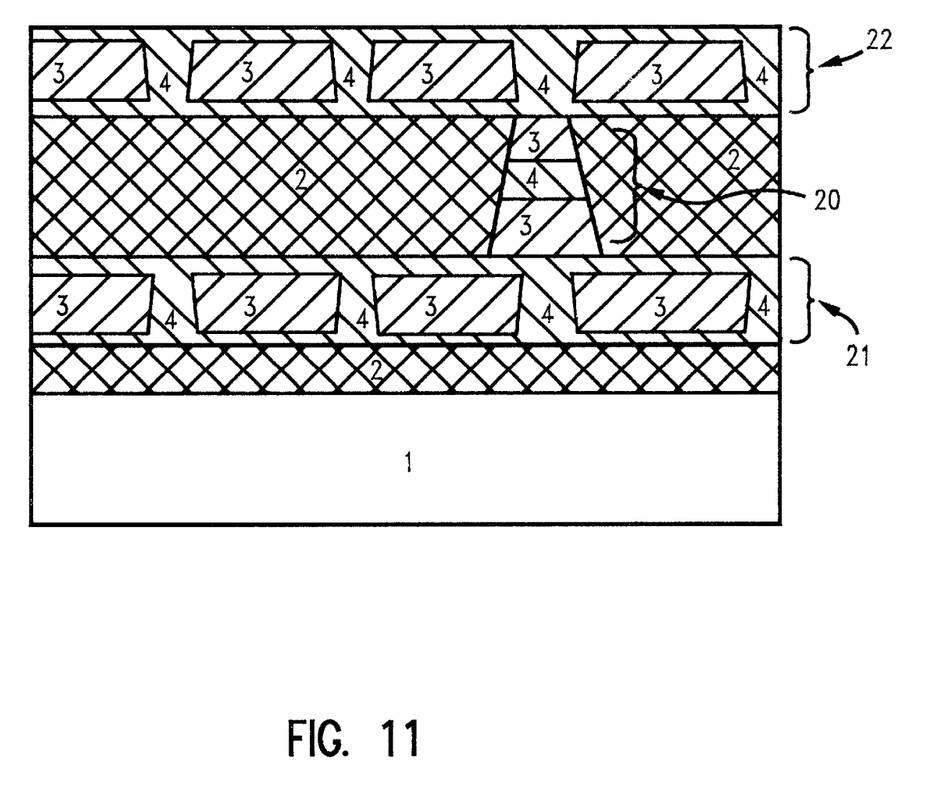
FIG. 11 shows a stud made of sections of refractory and conductive metals, wherein the stud joins two interconnection wires placed at different levels of an IC chip.

Referring now to FIG. 11, stud 20 is shown to connect interconnection wires 21 and 22 placed on different levels of an IC chip. The interconnection wires 21 and 22 conform to the metallurgy described in FIG. 10; the stud or via 20 is made of alternating horizontal sections of refractory and sections of conductive metal. It is evident that vertical sections within the stud could have been used equally well. More particularly, the Al islands are now formed inside of a stud which is then filled with refractory material to provide electrical integrity and continuity between interconnection lines placed on separate levels of the IC chip.

In other alternate embodiments, one may advantageously replace the Al islands with refractory metal, and likewise, the refractory metal layer with an Al layer. Similarly, the aforementioned stud or via can be interchangeably used in conjunction with any of the structured described previously, i.e., with an interconnection line made of independent sections linked to each other, or with an overlayer (underlayer) provided with sections protruding from the overlayer (underlayer) or any combination thereof.

The examples and embodiments described herein are only exemplary and that various modifications or changes in light thereof will be suggested to persons skilled in the art and are to be included within the spirit and purview of this application and scope of the appended claims.

Having thus described our invention, what we claim as new and desire to secure by letters patent is as follows:

1. An interconnection wiring structure on an insulated substrate in a semiconductor integrated circuit chip for minimizing electromigration, comprising:
   a sublayer of a diffusion barrier metal on said insulated substrate;
   a layer directly on, and in physical contact with, said sublayer, said layer having:
      section of high conductivity metal on said sublayer, and
      coplanar sections of said diffusion barrier metal interspersed between said sections of high conductivity metal;
   said sections of high conductivity metal and said sections of said diffusion barrier metal on said sublayer contacting each other to carry an electrical current, wherein said electrical current sequentially crosses said sections of high conductivity metal and said sections of said diffusion barrier metal.

2. The interconnection wiring structure of claim 1, wherein said high conductivity metal is selected from the group consisting of copper, aluminum, and aluminum alloy and said diffusion barrier metal is selected from the group consisting of tantalum, tantalum containing nitrogen, chromium, chromium/chromium oxide, titanium, titanium nitride, titanium-tungsten, hafnium, and any combination thereof.

3. An interconnection wiring structure on an insulated substrate in a semiconductor integrated circuit chip for minimizing electromigration, comprising:
   a sublayer of a first diffusion barrier metal on said insulated substrate at a position where the interconnection wiring is to be made;
   a layer directly on, and in physical contact with, said sublayer, said layer having;
      sections of high conductivity metal on said sublayer, and
      coplanar sections of a second diffusion barrier metal interspersed between said sections of high conductivity metal, wherein said second diffusion barrier metal is different from said first diffusion barrier metal;
   said sections of high conductivity metal and said sections of said second diffusion barrier metal on said sublayer contacting each other to carry an electrical current, wherein said electrical current sequentially crosses said sections of high conductivity metal and said sections of said second diffusion barrier metal.

4. The interconnection wiring structure as recited in claim 3, wherein said first and second diffusion barrier metals are each selected from the group consisting of tantalum, tantalum-nitride, titanium, titanium-nitride, chromium, chromium/chromium oxide, titanium-tungsten, hafnium, and any combination thereof.

5. The interconnection wiring as recited in claim 3, wherein said high conductivity metal is selected from the group consisting of copper, aluminum, and aluminum alloy.

6. An interconnection wiring structure on an insulated substrate in a semiconductor integrated circuit chip for minimizing electromigration, comprising:
   a layer on said insulated substrate, said layer having:
      sections of high conductivity metal on said substrate, and
      coplanar sections of a diffusion barrier metal interspersed between said sections of high conductivity metal; and
   an overlayer of said diffusion barrier metal on said layer of high conductivity and diffusion barrier metal section;
   said sections of high conductivity metal and said sections of said diffusion barrier metal contacting each other and contacting said overlayer to carry an electrical current, wherein said electrical current sequentially crosses said sections of high conductivity metal and said sections of said diffusion barrier metal.

7. The interconnection wiring structure of claim 6, wherein said high conductivity metal is selected from the group consisting of copper, aluminum, and aluminum alloy and said overlayer is made of a diffusion barrier metal selected from the group consisting of tantalum, tantalum containing nitrogen, chromium, chromium/chromium oxide, titanium, titanium nitride, titanium-tungsten, hafnium, and any combination thereof.

8. The interconnection wiring structure of claim 6, wherein each of said high conductivity metal sections has a length that ranges from 1 to 100 micrometers.

9. The interconnection wiring structure of claim 6, wherein each of said diffusion barrier metal sections has a length that ranges from 0.1 to 100 micrometers.

10. An interconnection wiring structure on an insulated substrate in a semiconductor integrated circuit chip for minimizing electromigration, comprising:

a sublayer of a diffusion barrier metal on said insulated substrate positioned where the interconnection wiring is to be made;

a layer directly on, and in physical contact with, said sublayer, said layer having:

sections of high conductivity metal on said sublayer, and coplanar sections of a diffusion barrier metal interspersed between said sections of high conductivity metal, said sections of high conductivity metal and said sections of diffusion barrier metal contacting each other to carry an electrical current, wherein said electrical current sequentially crosses said sections of high conductivity metal and said sections of diffusion barrier metal; and an overlayer of a diffusion barrier metal on said layer of high conductivity and diffusion barrier metal sections.

11. The interconnection wiring structure of claim 10, wherein said diffusion barrier metal is selected from the group consisting of tungsten, molybdenum, tantalum, tantalum containing nitrogen, titanium, chromium, chromium/chromium oxide and any combination thereof.

12. An interconnection wiring structure on an insulated substrate in a semiconductor integrated circuit chip for minimizing electromigration, comprising:

a sublayer of a first diffusion barrier metal on said insulated substrate;

a layer directly on, and in physical contact with, said sublayer, said layer having, sections of high conductivity metal on said sublayer, and coplanar sections of a second diffusion barrier metal interspersed between said sections of high conductivity metal, wherein said second diffusion barrier metal is different from said first diffusion barrier metal;

said sections of high conductivity metal and said sections of said second diffusion barrier metal contacting each other to carry an electrical current, wherein said electrical current sequentially crosses said sections of high conductivity metal and said sections of said second diffusion barrier metal, and an overlayer of said first diffusion barrier metal on said layer of high conductivity and second diffusion barrier metal sections.

13. In an integrated circuit chip provided with more than one level of wiring, each of said levels of wiring having at least one stud linking at least one interconnection in a first level to another interconnection in a second level, said interconnections for minimizing electromigration, said stud comprising:

a plurality of sections of conductive material; and a plurality of sections of diffusion barrier metal interspersed between said sections of conductive material, said sections of conductive material and said sections of diffusion barrier metal contacting each other to provide electrical continuity, wherein an electrical current flowing through said stud sequentially crosses each of said conductive sections and said diffusion barrier metal sections.

14. The stud recited in claim 13, wherein said sections of conductive material interspersed with said sections of diffusion material are placed horizontally.

15. The stud recited in claim 13, wherein said sections of conductive material interspersed with said sections of diffusion material are placed vertically.

16. An interconnection wiring structure on an insulated substrate in a semiconductor integrated circuit chip, comprising;

sections of high conductivity metal disposed at periodic intervals on said insulated substrate; and a diffusion barrier metal contacting at least three sides of each section of high conductivity metal, said sections of high conductivity metal and said diffusion barrier metal contacting each other to carry an electrical current, wherein said electrical current sequentially crosses said sections of high conductivity metal and said diffusion barrier metal.

17. The interconnection wiring structure of claim 16, wherein said diffusion barrier metal contacts a bottom side and at least two vertical sides of each section of high conductivity metal.

18. The interconnection wiring structure of claim 16, wherein said diffusion barrier metal contacts a top side and at least two vertical sides of each section of high conductivity metal.

19. The interconnection wiring structure of claim 16, wherein said diffusion barrier metal contacts a bottom side, a top side, and at least two vertical sides of each section of high conductivity metal.

* * * * *